US012795845B2

(12) United States Patent
Chun

(10) Patent No.: US 12,795,845 B2
(45) Date of Patent: Nov. 10, 2026

(54) COVER WINDOW AND DISPLAY DEVICE INCLUDING THE SAME

(71) Applicant: LG DISPLAY CO., LTD., Seoul (KR)

(72) Inventor: Changwoo Chun, Cheonan-si (KR)

(73) Assignee: LG Display Co., Ltd., Seoul (KR)

( * ) Notice: Subject to any disclaimer, the term of this patent is extended or adjusted under 35 U.S.C. 154(b) by 245 days.

(21) Appl. No.: 18/354,316

(22) Filed: Jul. 18, 2023

(65) Prior Publication Data

US 2024/0032231 A1 Jan. 25, 2024

(30) Foreign Application Priority Data

Jul. 21, 2022 (KR) ........................ 10-2022-0090556

(51) Int. Cl.
*H05K 5/03* (2006.01)

(52) U.S. Cl.
CPC ..................................... *H05K 5/03* (2013.01)

(58) Field of Classification Search
None
See application file for complete search history.

(56) References Cited

U.S. PATENT DOCUMENTS

2013/0003181 A1* 1/2013 Hayashibe ............. G02B 1/118
359/585
2014/0287213 A1* 9/2014 Lee ......................... B32B 27/36
428/217
2016/0204377 A1* 7/2016 Jeong ................... H10K 59/873
428/101

FOREIGN PATENT DOCUMENTS

JP 2010137400 A * 6/2010

* cited by examiner

*Primary Examiner* — Tamra L. Dicus
(74) *Attorney, Agent, or Firm* — Fenwick & West LLP

(57) ABSTRACT

Embodiments of the disclosure relate to a cover window and a display device including the cover window. Specifically, there may be provided a cover window having enhanced flexibility by efficiently dispersing the stress applied during elongation by including a hard coating layer having a plurality of hexagonal patterns and a display device including the cover window.

19 Claims, 22 Drawing Sheets

COVER WINDOW AND DISPLAY DEVICE INCLUDING THE SAME

CROSS-REFERENCE TO RELATED APPLICATION

This application claims priority from Republic of Korea Patent Application No. 10-2022-0090556, filed on Jul. 21, 2022, which is hereby incorporated by reference fin its entirety.

BACKGROUND

Field

Embodiments of the disclosure relate to a cover window and a display device including the same.

Description of Related Art

The growth of information society leads to various needs for displays and wide use of various forms of displays, such as liquid crystal displays (LCDs), plasma display panels (PDPs), or organic light emitting diode displays (OLEDs). These various display devices include a display panel suitable thereto and a cover window for protecting the display panel.

In recent years, technology has been developed to reduce the screen size for better space utilization and design to achieve portability, thus producing new types of flexible display devices, such as curved display devices, rollable or foldable display devices.

Accordingly, to enhance flexibility as well as optical characteristics of a cover window applicable to flexible display devices, research is being conducted to relieve various stresses caused by surface characteristics or bending.

SUMMARY

Glass is used due to the optical characteristics of the cover window applied to the display device. However, as it is difficult to roll glass, a hard coating is applied to the surface of a transparent film such as transparent polyimide, but relieving stress applied to the entire area during rolling is limited.

Therefore, the inventors of the disclosure have invented a cover window capable of efficiently dispersing the stress applied during elongation to enhance flexibility by forming a structure in which a hard coating layer having a plurality of hexagonal patterns is disposed on a base layer, and a display device including the cover window.

Embodiments of the disclosure may provide a cover window capable of enhancing flexibility by efficiently dispersing the stress applied during elongation and a display device including the cover window.

Embodiments of the disclosure may provide a cover window comprising a base layer and a hard coating layer positioned on the base layer and having a plurality of hexagonal patterns.

Embodiments of the disclosure may provide a display device comprising a display panel and a cover window positioned on the display panel, wherein the cover window includes a base layer and a hard coating layer disposed on the base layer and having a plurality of hexagonal patterns.

According to embodiments of the disclosure, there may be provided a cover window capable of efficiently dispersing the stress applied during elongation to enhance flexibility by forming a structure in which a hard coating layer having a plurality of hexagonal patterns is disposed on a base layer, and a display device including the cover window.

BRIEF DESCRIPTION OF THE DRAWINGS

The above and other objects, features, and advantages of the disclosure will be more clearly understood from the following detailed description, taken in conjunction with the accompanying drawings, in which.

DETAILED DESCRIPTION

Figure 1:
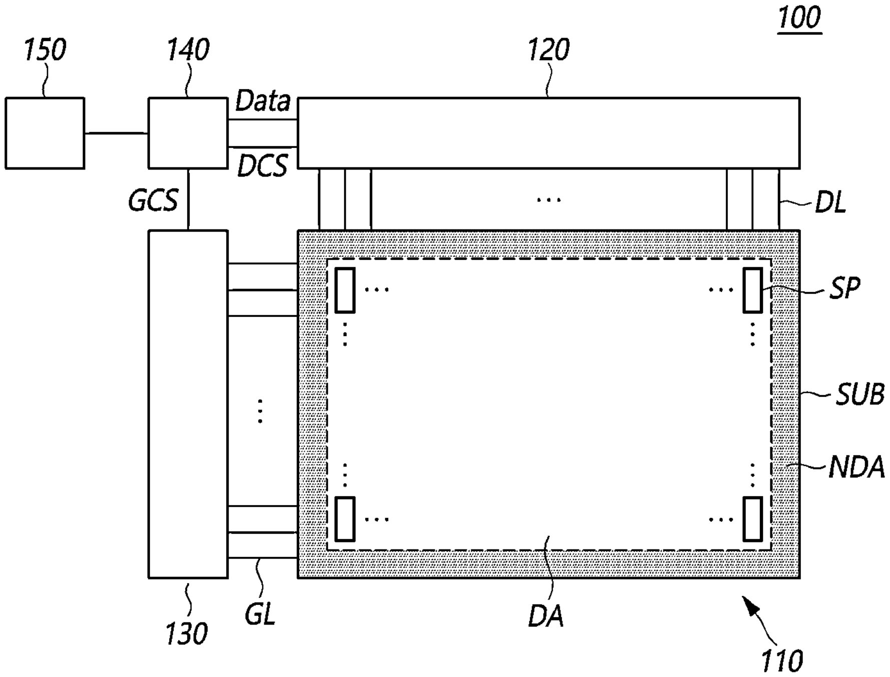
FIG. 1 is a view illustrating a system configuration of a display device according to embodiments of the disclosure.

In the following description of examples or embodiments of the disclosure, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the disclosure, detailed descriptions of well-known functions and components incorporated herein will be omitted when it is determined that the description may make the subject matter in some embodiments of the disclosure rather unclear.

The terms such as “including”, “having”, “containing”, “constituting” “make up of”, and “formed of” used herein are generally intended to allow other components to be added unless the terms are used with the term “only”. As used herein, singular forms are intended to include plural forms unless the context clearly indicates otherwise.

Terms, such as "first", "second", "A", "B", "A", or "B" may be used herein to describe elements of the disclosure. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors e.g., process factors, internal or external impact, noise, etc.) even when a relevant description is not specified. Further, the term "may" fully encompasses all the meanings of the term "can".

Hereinafter, various embodiments of the disclosure are described in detail with reference to the accompanying drawings.

FIG. 1 is a view schematically illustrating a system configuration of a display device 100 according to embodiments of the disclosure.

Referring to FIG. 1, a display device 100 according to embodiments of the disclosure may include a display panel 110 and driving circuits for driving the display panel 110.

The driving circuits may include a data driving circuit 120 and a gate driving circuit 130. The display device 100 may further include a controller 140 controlling the data driving circuit 120 and the gate driving circuit 130.

The display panel 110 may include a substrate SUB and signal lines, such as a plurality of data lines DL and a plurality of gate lines GL disposed on the substrate SUB. The display panel 110 may include a plurality of subpixels SP connected to the plurality of data lines DL and the plurality of gate lines GL.

The display panel 110 may include a display area DA in which images are displayed and a non-display area NDA in which no image is displayed. In the display panel 110, a plurality of subpixels SP for displaying images may be disposed in the display area DA, and the driving circuits 120, 130, and 140 may be electrically connected or disposed in the non-display area NDA. Further, pad units for connection of integrated circuits or a printed circuit may be disposed in the non-display area NA.

The data driving circuit 120 is a circuit for driving the plurality of data lines DL, and may supply data signals to the plurality of data lines DL. The gate driving circuit 130 is a circuit for driving the plurality of gate lines GL, and may supply gate signals to the plurality of gate lines GL. The controller 140 may supply a data control signal DCS to the data driving circuit 120 to control the operation timing of the data driving circuit 120. The controller 140 may supply a gate control signal GCS for controlling the operation timing of the gate driving circuit 130 to the gate driving circuit 130.

The controller 140 may start scanning according to a timing implemented in each frame, convert input image data input from the outside into image data Data suited for the data signal format used in the data driving circuit 120, supply the image data Data to the data driving circuit 120, and control data driving at an appropriate time suited for scanning.

To control the gate driving circuit 130, the controller 140 may output various gate control signals GCS including a gate start pulse GSP, a gate shift clock GSC, and a gate output enable signal GOE.

To control the data driving circuit 120, the controller 140 may output various data control signals DCS including a source start pulse SSP, a source sampling clock SSC, and a source output enable signal SOE, for example.

The controller 140 may be implemented as a separate component from the data driving circuit 120, or the controller 140, along with the data driving circuit 120, may be implemented as an integrated circuit.

The data driving circuit 120 receives the image data Data from the controller 140 and supply data voltages to the plurality of data lines DL, thereby driving the plurality of data lines DL. The data driving circuit 120 is also referred to as a 'source driving circuit.'

The data driving circuit 120 may include one or more source driver integrated circuit (SDICs).

For example, each source driver integrated circuit (SDIC) may be connected with the display panel 110 by a tape automated bonding (TAB) method or connected to a bonding pad of the display panel 110 by a chip on glass (COG) or chip on panel (COP) method or may be implemented by a chip on film (COF) method and connected with the display panel 110.

The gate driving circuit 130 may output a gate signal of a turn-on level voltage or a gate signal of a turn-off level voltage according to the control of the controller 140. The gate driving circuit 130 may sequentially drive the plurality of gate lines GL by sequentially supplying gate signals of the turn-on level voltage to the plurality of gate lines GL.

The gate driving circuit 130 may be connected with the display panel 110 by TAB method or connected to a bonding pad of the display panel 110 by a COG or COP method or may be connected with the display panel 110 according to a COF method. Alternatively, the gate driving circuit 130 may be formed in a gate in panel (GIP) type, in the non-display area NDA of the display panel 110. The gate driving circuit 130 may be disposed on the substrate SUB or may be connected to the substrate SUB. In other words, the gate driving circuit 130 that is of a GIP type may be disposed in the non-display area NDA of the substrate SUB. The gate driving circuit 130 that is of a chip-on-glass (COG) type or chip-on-film (COF) type may be connected to the substrate SUB.

Meanwhile, at least one of the data driving circuit 120 and the gate driving circuit 130 may be disposed in the display area DA. For example, at least one of the data driving circuit 120 and the gate driving circuit 130 may be disposed not to overlap the subpixels SP or to overlap all or some of the subpixels SP.

When a specific gate line GL is opened by the gate driving circuit 130, the data driving circuit 120 may convert the image data Data received from the controller 140 into an analog data voltage and supply it to the plurality of data lines DL.

The data driving circuit 120 may be connected to one side (e.g., an upper or lower side) of the display panel 110. Depending on the driving scheme or the panel design scheme, data driving circuits 120 may be connected with both the sides (e.g., both the upper and lower sides) of the display panel 110, or two or more of the four sides of the display panel 110.

The gate driving circuit 130 may be connected to one side (e.g., a left or right side) of the display panel 110. Depending on the driving scheme or the panel design scheme, gate driving circuits 130 may be connected with both the sides (e.g., both the left and right sides) of the display panel 110, or two or more of the four sides of the display panel 110.

The controller 140 may be a timing controller used in typical display technology, a control device that may perform other control functions as well as the functions of the timing controller, or a control device other than the timing controller, or may be a circuit in the control device. The controller 140 may be implemented as various circuits or electronic components, such as an integrated circuit (IC), a field programmable gate array (FPGA), an application specific integrated circuit (ASIC), or a processor.

The controller 140 may be mounted on a printed circuit board or a flexible printed circuit and may be electrically connected with the data driving circuit 120 and the gate driving circuit 130 through the printed circuit board or the flexible printed circuit.

The display device 100 according to embodiments of the disclosure may be a display including a backlight unit, such as a liquid crystal display, or may be a self-emission display, such as an organic light emitting diode (OLED) display, a quantum dot display, or a micro light emitting diode (LED) display.

According to an embodiment, when the display device 100 is an OLED display, each subpixel SP may include an organic light emitting diode (OLED), which is self-luminous, as a light emitting element. According to an embodiment, when the display device 100 is a quantum dot display, each subpixel SP may include a light emitting element formed of a quantum dot, which is a self-luminous semiconductor crystal. According to an embodiment, when the display device 100 is a micro LED display, each subpixel SP may include a micro light emitting diode), which is self-luminous and formed of an inorganic material, as a light emitting element.

Figure 2:
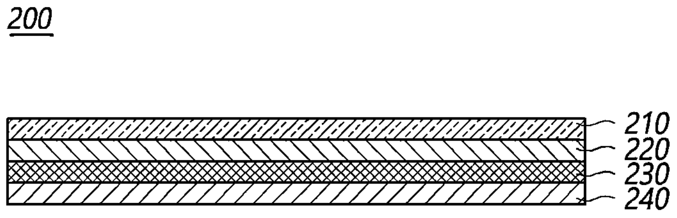
FIG. 2 is a cross-sectional view schematically illustrating a display device according to embodiments of the disclosure.

FIG. 2 is a cross-sectional view schematically illustrating a display device according to embodiments of the disclosure.

Referring to FIG. 2, the display device 200 according to embodiments of the disclosure may include a cover window 210 and a display panel 230.

The cover window 210 serves to protect the surface of the display panel without deterioration of the image provided from the display panel 230 or glare to the user. To this end, the cover window 210 is required to be transparent, and also requires an anti-glare (AG) characteristic for preventing glare to the user, and an anti-fingerprint (AF) characteristic for preventing the fingerprint of the user from being left on the surface of the cover window.

The display panel 230 includes a display area and a non-display area. The display area is an area in which a plurality of pixels are disposed to display an image. A pixel including an emission area for displaying an image and a driving circuit for driving the pixel may be disposed in the display area. The non-display area is disposed to surround the display area. The non-display area is an area in which no image is displayed, and is an area in which various lines, driving ICs, and a printed circuit board for driving the pixels and driving circuits are disposed.

The display panel 230 may be an organic light emitting display panel or a micro LED display panel capable of easily securing flexibility, such as rollability or stretchability.

A polarization layer 220 may be disposed between the cover window 210 and the display panel 230.

The polarization layer 220 serves to absorb external light to enhance the contrast ratio of external light between the cover window 210 and the display panel 230. However, the polarization layer 220 may or may not be disposed according to the case.

A back plate 240 may be disposed on the rear surface of the display panel 230.

The back plate 240 may refer to a back plate 240 having excellent flexibility.

The back plate 240 may include one selected from among polyurethane (PU), thermoplastic polyurethane (TPU), silicon Si), polydimethylacrylamide (PDMA), a metal such as amorphous metal, polymethyl metacrylate (PMMA), polycarbonate (PC), polyvinylalcohol (PVA), acrylonitirle-butadiene-styrene (ABS), or polyethylene terephthalate (PET).

In this case, the thickness of the back plate 240 may be 150 μm to 200 μm, for example. When the back plate 240 is in the above-described thickness range, impact resistance may be enhanced without degrading the flexibility. Further, when the thickness is less than 150 μm, the impact resistance of the display device 200 may be less enhanced, and when the thickness is 200 μm or more, the flexibility, especially the rollability, may be rapidly deteriorated.

Figure 3:
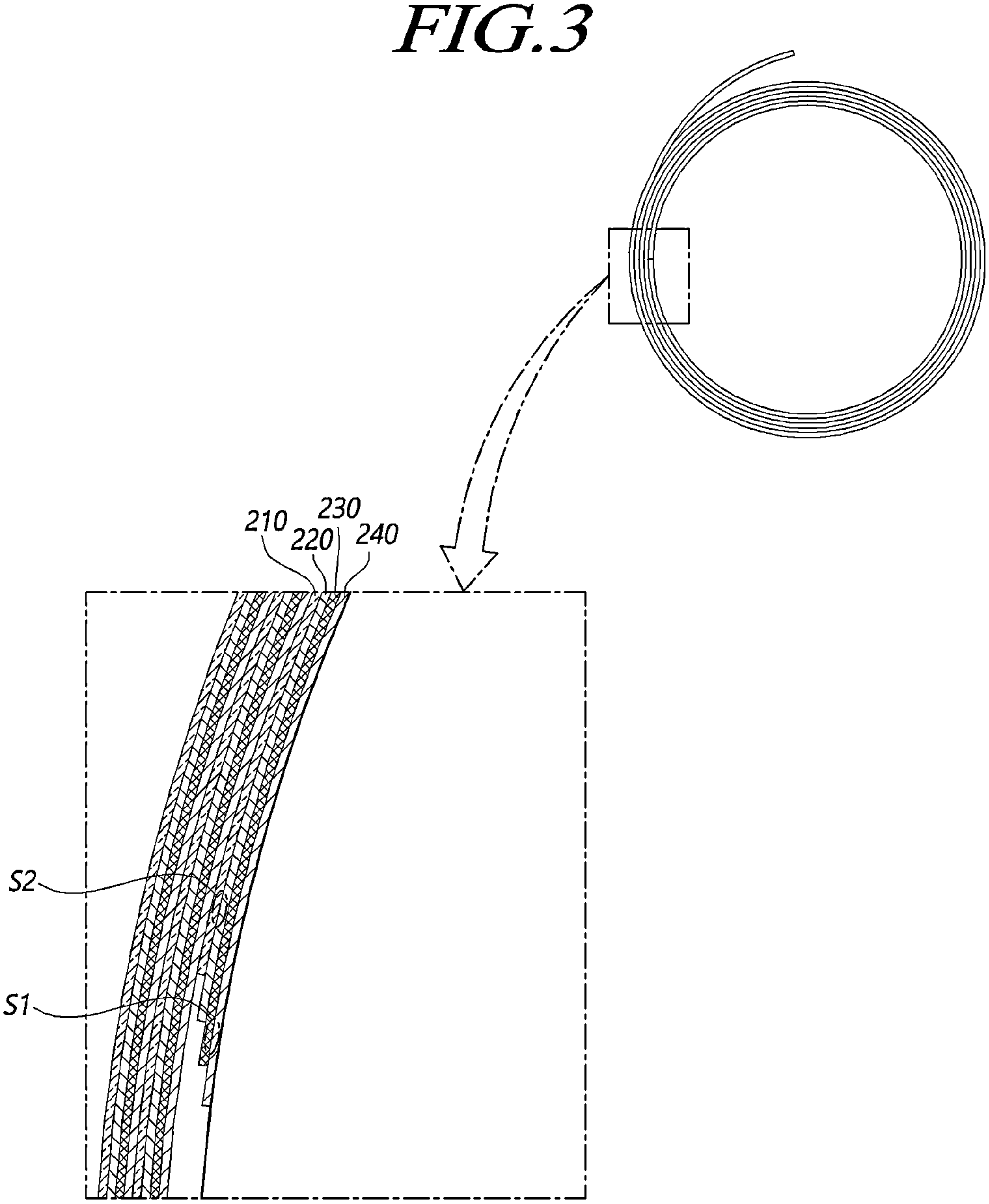
FIG. 3 is a view illustrating a folding simulation of a display device according to embodiments of the disclosure.

FIG. 3 is a view illustrating a folding simulation of a display panel according to embodiments of the disclosure, and is a simulation view illustrating a slip distribution for each layer when the display device 200 illustrated in FIG. 2 is out-rolled with a curvature radius of 10R.

Referring to FIG. 3, an area 51 in which stacking of the display panel 230 and the back plate 240 begins is more stressed than an area S2 in which stacking of the cover window 210 and the polarization layer 220 begins. Accordingly, when the display device 200 illustrated in FIG. 2 is out-rolled with a curvature radius of 10R and rotated by 2.5 times, delamination may occur due to slip accumulation for each layer, and in particular, there is a high possibility of delamination or cracking in the cover window 210 disposed outside the display device 200.

Figure 4:
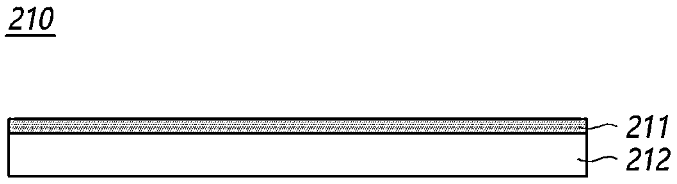
FIG. 4 is a cross-sectional view schematically illustrating a cover window according to embodiments of the disclosure.
Figure 5A:
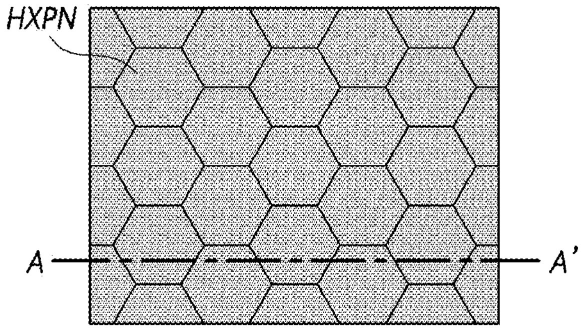
FIG. 5A is a plan view schematically illustrating a cover window to which a hard coating layer is applied according to embodiments of the disclosure.
Figure 5B:
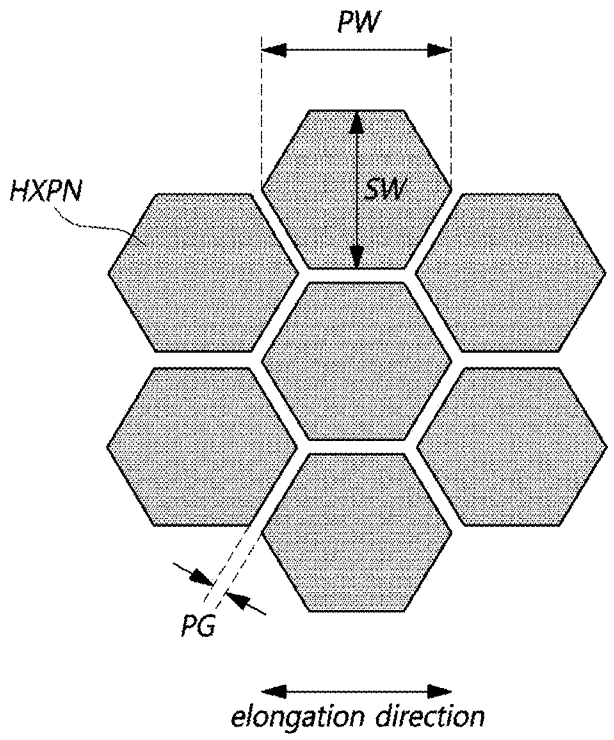
FIGS. 5B and 5C respectively illustrate a plan view and a cross-sectional view illustrating a hard coating layer of a cover window according to embodiments of the disclosure.
Figure 5C:
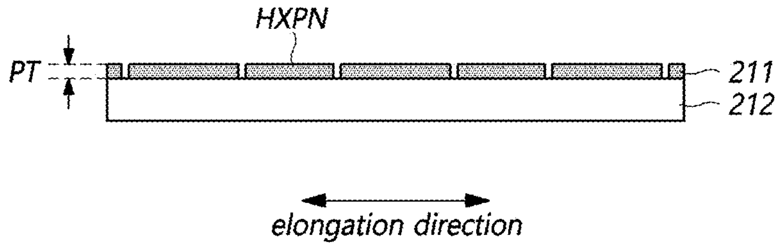

FIG. 4 is a cross-sectional view schematically illustrating a cover window according to embodiments of the disclosure. FIG. 5A is a plan view schematically illustrating a cover window to which a hard coating layer is applied according to embodiments of the disclosure. FIGS. 5B and 5C respectively illustrate a plan view and a cross-sectional view illustrating a hard coating layer of a cover window according to embodiments of the disclosure.

Referring to FIGS. 4, 5A, 5B, and 5C, a cover window 210 according to embodiments of the disclosure includes a base layer 212 and a hard coating layer 211 positioned on the base layer 212 and having a plurality of hexagonal patterns HXPN.

The patterns HXPN may be disposed in the hard coating layer 211 and may be disposed to be separated from each other, but are not limited thereto. The patterns HXPN may be disposed while maintaining a predetermined separation distance from the adjacent patterns HXPN. Further, when the cover window 210 is not elongated, adjacent patterns HXPN are disposed in contact with each other, but when the cover window 210 is elongated, a predetermined separation distance may be maintained. In other words, when the cover window 210 is not elongated, a separation distance between adjacent patterns HXPN may be 0 μm.

The thickness PT of the patterns HXPN may be 5 μm or more and 25 μm or less, or in a range of 10 μm or more and 20 μm or less. Increasing the thickness PT of the patterns HXPN is better to exhibit surface characteristics but, decreasing the thickness PT is better for flexibility such as rollability. In other words, when the thickness PT of the patterns HXPN is less than 5 μm, it is insufficient to exhibit the surface characteristics, and when the thickness PT of the patterns HXPN exceeds 25 μm, the rollability may rapidly decrease.

The maximum width of the patterns HXPN may be 25 μm or more and 110 μm or less, and in a range of 30 μm or more and 100 μm or less in one embodiment. In this case, the maximum width of the patterns HXPN means the maximum among the widths PW between the opposite vertices and the widths SW between the opposite sides of the hexagonal shapes. When the maximum width of the patterns HXPN is less than 25 μm, it is insufficient to exhibit surface characteristics and optical characteristics, and when the maximum width of the patterns HXPN is more than 110 μm, rollability may be decreased.

Further, the ratio of the maximum width of the patterns HXPN to the thickness PT of the patterns HXPN may be 3 to 5. If this ratio is less than 3, the rollability may be decreased, and if the ratio is more than 5, it is difficult to exhibit the surface characteristics.

The separation distance PG of the patterns HXPN may be 12.5 μm or less, and 10 μm or less in one embodiment. When the cover window 210 is not elongated, the separation distance PG between adjacent patterns HXPN may be 0 μm. When the separation distance PG between the patterns HXPN exceeds 12.5 μm, surface characteristics and optical characteristics may be insufficient.

Further, a ratio of the separation distance PG of the patterns HXPN to the thickness PT of the patterns HXPN may be ½ or less. If this ratio exceeds 1/2, the surface characteristics and optical properties may be insufficient.

The hexagonal shapes of the patterns HXPN may have the same length of all sides, and the hexagonal shapes of the patterns HXPN may have the same size of all interior angles. In other words, the hexagonal shape of the patterns HXPN may be a regular hexagonal shape. When the shapes of the patterns HXPN are regular hexagonal shapes, the stress applied to the cover window 210 may be uniformly dispersed during rolling.

The patterns HXPN may include a silicone resin, an acrylic resin, or an epoxy resin. When the patterns HXPN of the hard coating layer 211 are formed of a silicone resin, an acrylic resin, or an epoxy resin, flexibility may be easily exhibited, and surface rigidity may also be exhibited.

The base layer 212 may include an elastic polymer which is an elastomer. When the base layer 212 includes an elastic polymer, the base layer 212 is free to elongate when rolling, so that the base layer 212 may absorb most of the stress applied to the adhesive member, thereby preventing delamination.

The cover window 210 according to embodiments of the disclosure may be applied to various display devices supposed to have flexibility. For example, the cover window may be used in various types of flexible display devices such as rollable display devices, static stretchable display devices, and dynamic stretchable display devices.

Figure 6A:
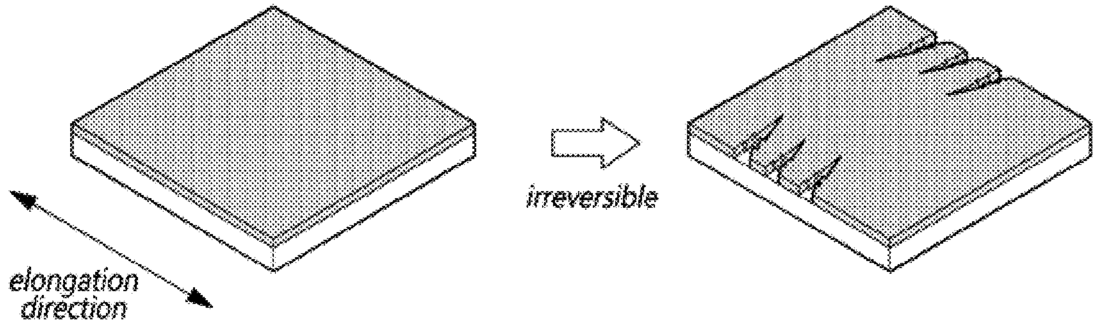
FIG. 6A is a schematic diagram of elongation evaluation for a hard coating layer structure to which a patternless single coating is applied and FIGS. 6B, 6C, 6D, and 6E are views illustrating images of elongation evaluation.
Figure 6B:
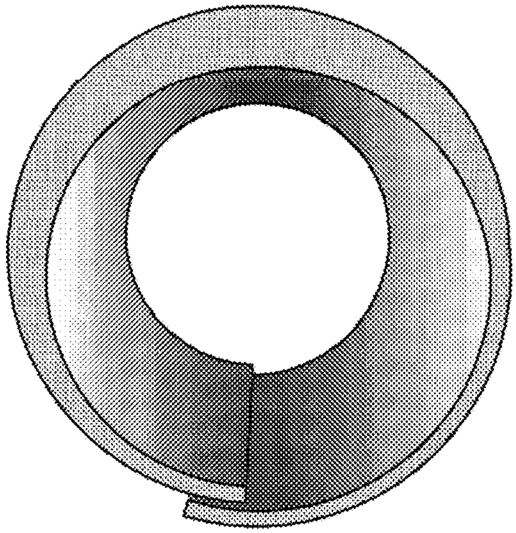
Figure 6C:
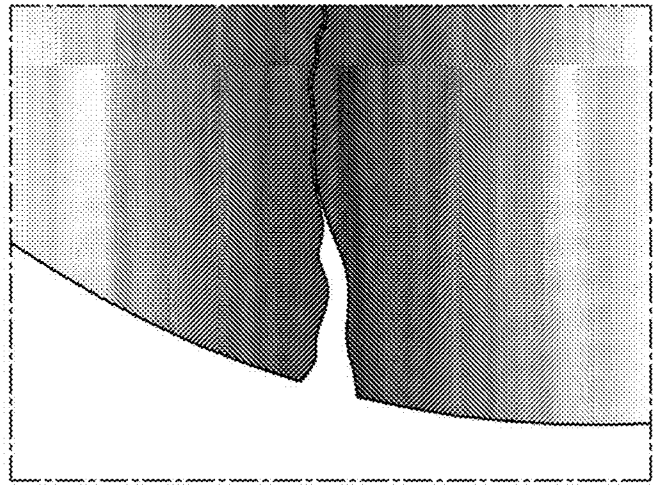
Figure 6D:
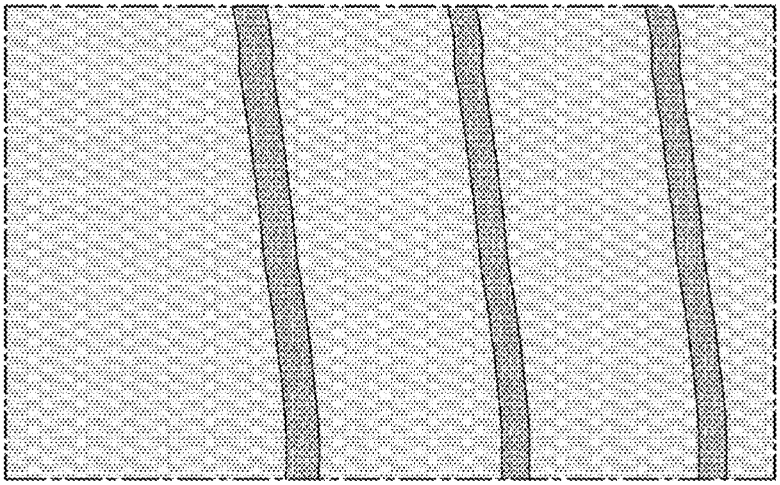
Figure 6E:
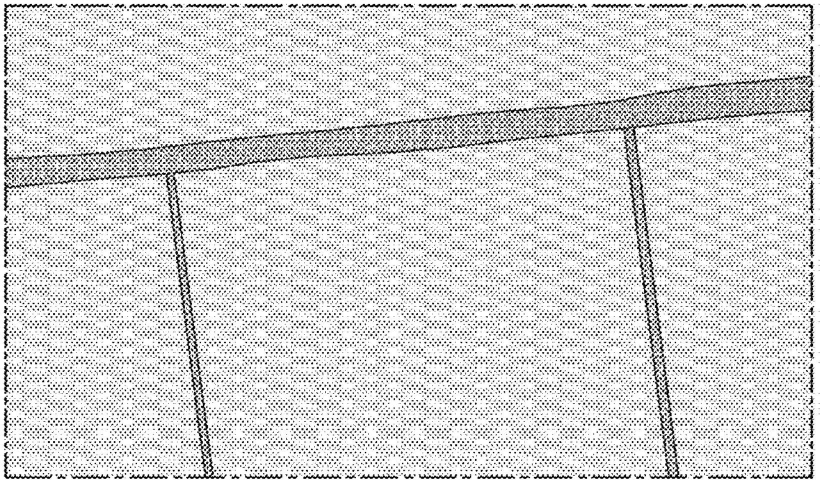

FIG. 6A is a schematic diagram of elongation evaluation for a hard coating layer structure to which a patternless single coating is applied, and FIGS. 6B, 6C, 6D, and 6E are views illustrating images of elongation evaluation.

Referring to FIGS. 6A to 6E, when the surface is observed after 5% elongation evaluation is performed on the hard coating layer structure to which a patternless single coating is applied in the elongation direction shown in FIG. 6A, it may be identified that curls are generated throughout the hard coating layer and cracks are generated in the surface of the hard coating layer.

Figure 7A:
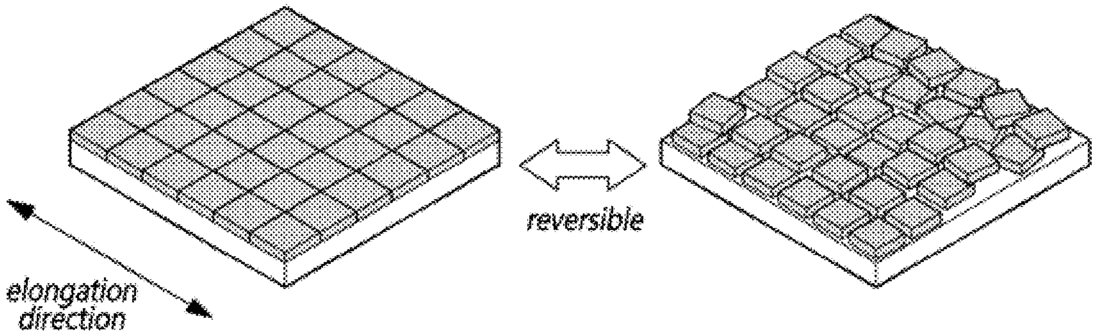
FIG. 7A is a schematic diagram of elongation evaluation for a hard coating layer structure to which a rectangular pattern coating is applied.
Figure 7B:
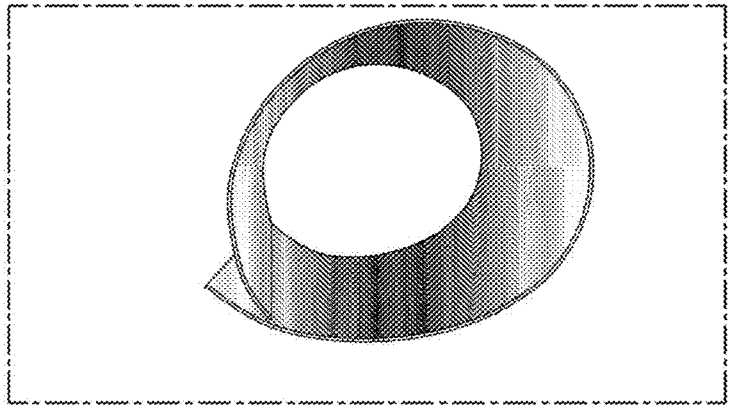
FIGS. 7B, 7C, and 7D are views illustrating images of elongation evaluation.
Figure 7C:
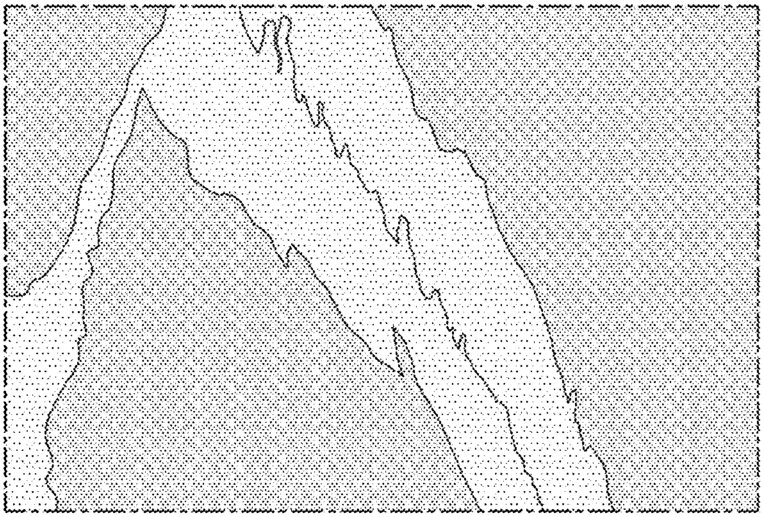
Figure 7D:
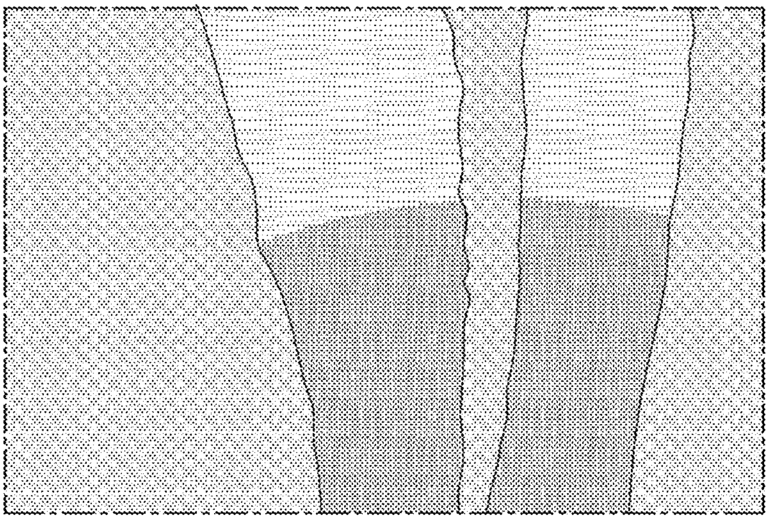

FIG. 7A is a schematic diagram of elongation evaluation for a hard coating layer structure to which a rectangular pattern coating is applied, and FIGS. 7B, 7C, and 7D are views illustrating images of elongation evaluation.

Referring to FIGS. 7A to 7D, when the surface is observed after 5% elongation evaluation is performed on the hard coating layer structure to which the rectangular pattern coating is applied, it may be identified that a small amount of curls are generated throughout the hard coating layer, and cracks are not observed because the surface patterns are spaced apart in the direction of elongation. But when 5% elongation is performed in the elongation axis direction, elongation occurs in the direction perpendicular to the elongation axis rather than being elongated uniformly, due to a change in volume, so that pattern cross sections overlap each other, causing wrinkles.

Figure 8A:
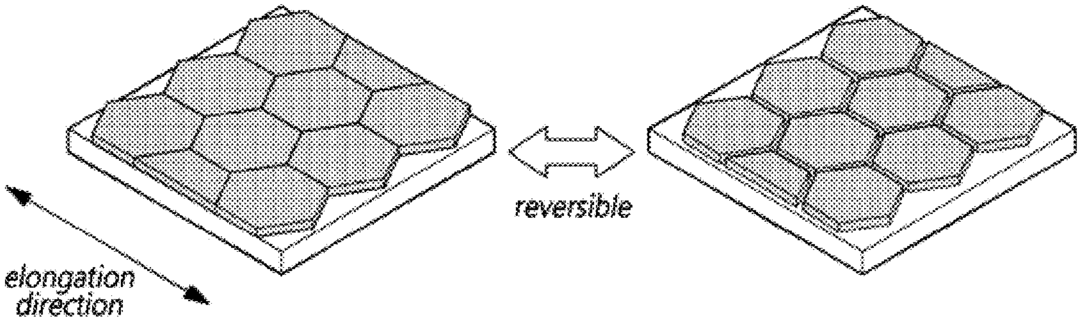
FIG. 8A is a schematic diagram of elongation evaluation for a hard coating layer structure to which a hexagonal pattern coating according to embodiments of the disclosure is applied.
Figure 8B:
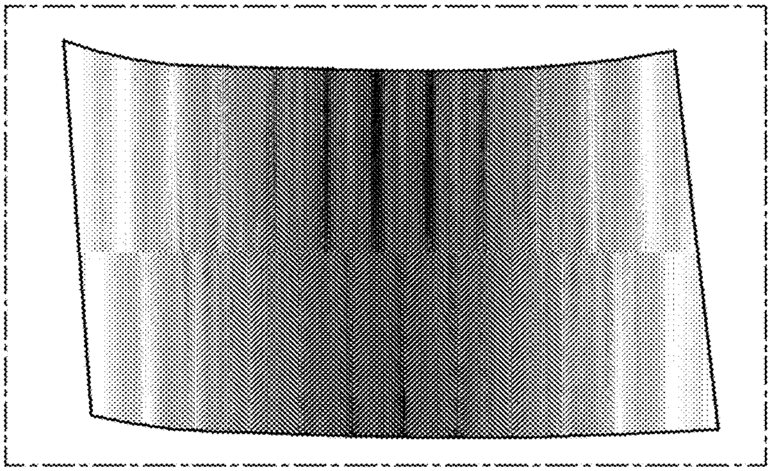
FIGS. 8B, 8C, and 8D are views illustrating images of elongation evaluation.
Figure 8C:
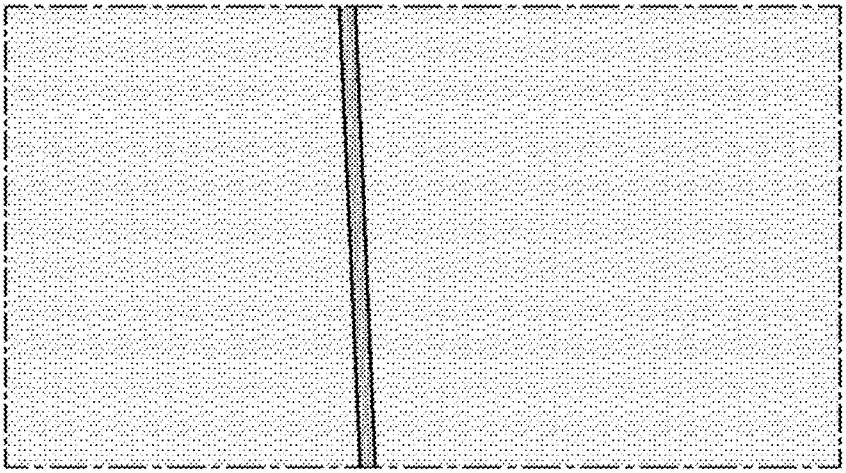
Figure 8D:
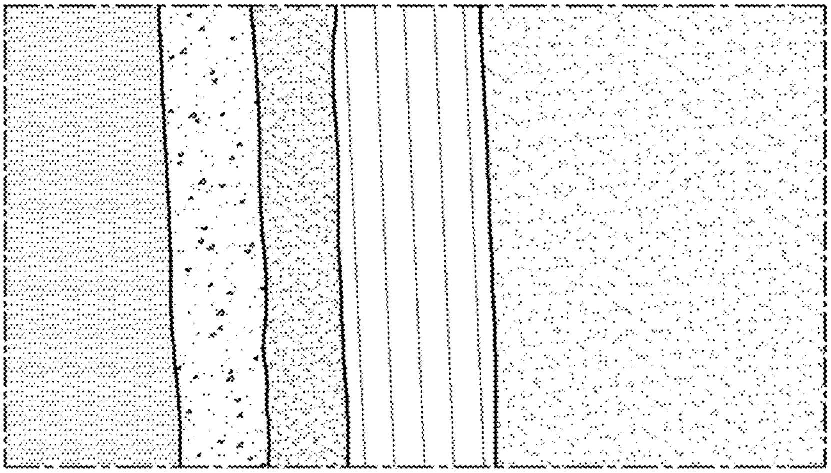

FIG. 8A is a schematic diagram of elongation evaluation for a hard coating layer structure to which a hexagonal pattern coating according to embodiments of the disclosure is applied, and FIGS. 8B, 8C, and 8D are views illustrating images of elongation evaluation.

Referring to FIGS. 8A to 8D, when the surface is observed after 5% elongation evaluation is performed on the hard coating layer structure to which the hexagonal pattern coating according to the embodiments of the disclosure is applied, it may be identified that no curl is generated throughout the hard coating layer, no cracks are observed because the surface patterns are uniformly spaced apart in the elongation direction, and even when 5% elongation is performed in the elongation axis direction, hexagonal patterns are elongated without interference with each other to have a natural curved shape and no wrinkles are generated even in the repeating characteristics.

TABLE 1

| Pattern type | — | no pattern | | | circular shape | rectangular shape | hexagonal shape |
|---|---|---|---|---|---|---|---|
| surface hardness | pencil hardness | 500 g load | ≥3H | 6B↓ | 6B | H | 3H |
| | Steel Wool | 500 g load @_2 × 2 $cm^2$ | ≥500 times | 100 | 100 | 200 | 500 |
| optical characteristics | transmittance | % | ≥90 | 90.3 | 89.5 | 90.52 | 90.2 |
| | Haze | — | ≤2 | 1.2 | 3.1 | 2.15 | 2.3 |
| | YI | — | ≤2.5 | 2.11 | 2.1 | 1.9 | 2.15 |

TABLE 1-continued

| Pattern type | — | no pattern | circular shape | rectangular shape | hexagonal shape |
|---|---|---|---|---|---|
| curled | | ○ | Δ | Δ | X |
| Rolling characteristics | | X | Δ | Δ | ○ |
| cracked | | ○ | X | X | X |

Table 1 shows the characteristics of the hard coating layer according to the pattern shape and the circular pattern disclosed in FIGS. 6A to 8D.

Referring to Table 1, as shown in FIGS. 6A to 6E, the No pattern has issues such as poor surface hardness and scratches, curls, rollability deterioration, cracks, and the like. As illustrated in FIGS. 7A to 7D, the rectangular pattern has issues such as a reduction in surface hardness and wrinkles due to interference between patterns. The circular pattern has issues such as poor surface hardness and scratches, deterioration of optical characteristics, and curls.

On the other hand, it may be identified that the hexagonal pattern coating according to the embodiments of the disclosure does not generate wrinkles, curls, and cracks due to uniform elongation, while exhibiting good surface hardness, scratch evaluation, and optical characteristics.

Figure 9:
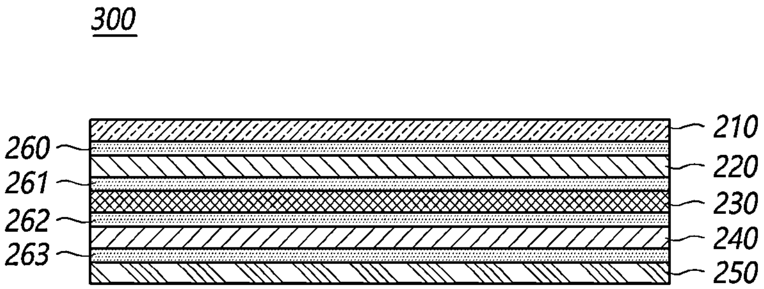
FIG. 9 is a cross-sectional view schematically illustrating a stack structure of a display device according to another embodiment of the disclosure.

FIG. 9 is a cross-sectional view schematically illustrating a stack structure of a display device according to another embodiment of the disclosure.

Referring to FIG. 9, display device 300 according to embodiments of the disclosure may further include a plate assembly 250 on the rear surface of the back plate 240.

The plate assembly 250 may be disposed on the rear surface of the back plate 240 to more firmly support the display panel 230.

Although not illustrated, the plate assembly 250 may include a plate top and a plate bottom. The plate top and the plate bottom may be integrally formed, and if necessary, the plate top or the plate bottom may be omitted.

Referring to FIG. 9, the cover window 210 and the polarization layer 220 may be fixed by a first adhesive member 260, and the polarization layer 220 and the display panel 230 may be fixed by a second adhesive member 261. The first and second adhesive members 260 and 261 may be transparent adhesive members having excellent visible light transmission characteristics to display an image of the display panel 230.

The transparent adhesive member may be an optical clear adhesive (OCA), a pressure sensitive adhesive (PSA), or the like, but is not limited thereto. For example, when the transparent adhesive member is formed of OCA, the adhesion may be controlled by adding an additive to the OCA. For example, an additive that causes heat, UV, light, chemical reaction, or the like may be mixed with the transparent adhesive member, but is not limited thereto.

The display panel 230 and the back plate 240 may be fixed by a third adhesive member 262, and the back plate 240 and the plate assembly 250 may be fixed by a fourth adhesive member 263. Since the third and fourth adhesive members 262 and 263 are positioned on the rear surface of the display panel 230, the third and fourth adhesive members 262 and 263 are not limited by visible light transmittance.

The third and fourth adhesive members 262 and 263 may be formed of OCA, PSA, or the like, but are not limited thereto. For example, when the third and fourth adhesive members 262 and 263 are formed of OCA, the adhesion may be controlled by adding an additive to the OCA. For example, additives that cause heat, UV, light, chemical reactions, etc. may be mixed with the third and fourth adhesive members 262 and 263, but are not limited thereto.

Figure 10:
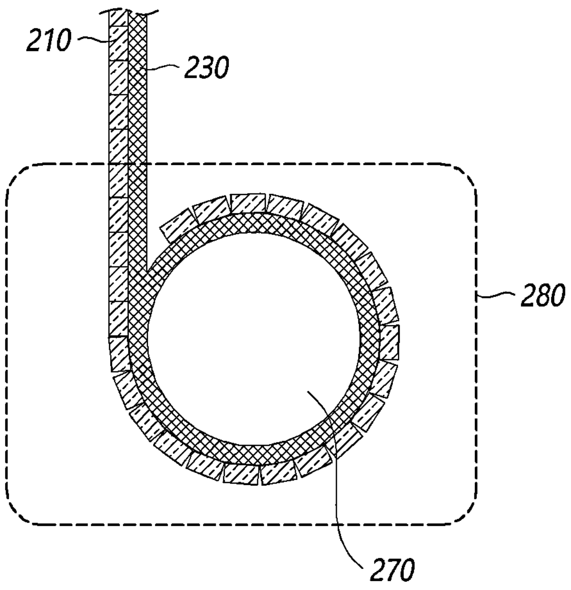
FIG. 10 is a view schematically illustrating a rollable display device according to embodiments of the disclosure.

FIG. 10 is a view schematically illustrating a rollable display device according to embodiments of the disclosure.

Referring to FIG. 10, in the rollable display device according to embodiments of the disclosure, the display device stack including the cover window 210 and the display panel 230 may be mounted to be wound on the roller 270 positioned in the housing 280 with a constant curvature by out-rolling.

Even if the display device is wound on the roller 270 in the out-rolling manner, the hexagonal patterns are uniformly spaced apart from each other in the rolling direction, which is the elongation direction, and are elongated without interference to have a natural curved shape, so that wrinkles or cracks do not occur despite repeated winding.

As such, according to embodiments of the disclosure, it is possible to efficiently disperse the stress applied during elongation to enhance flexibility by forming a structure in which a hard coating layer having a plurality of hexagonal patterns is disposed on a base layer.

Example embodiments of the present disclosure may be described as follows.

A cover window according to embodiments of the present disclosure may include: a base layer; and a hard coating layer positioned on the base layer and having a plurality of hexagonal patterns.

According to some embodiments of the present disclosure, the patterns of the hard coating layer may be separated from each other.

According to some embodiments of the present disclosure, a ratio of a maximum width of the patterns to a thickness of the patterns may be 3 to 5.

According to some embodiments of the present disclosure, a ratio of a separation distance between the patterns to a thickness of the patterns may be ½ or less.

According to some embodiments of the present disclosure, the patterns may have a thickness of 5 μm or more and 25 μm or less.

According to some embodiments of the present disclosure, the patterns may have a maximum width of 25 μm or more and 110 μm or less.

According to some embodiments of the present disclosure, a separation distance between the patterns may be 12.5 μm or less.

According to some embodiments of the present disclosure, all sides of the hexagonal shapes of the patterns may have the same length.

According to some embodiments of the present disclosure, all interior angles of the hexagonal shapes of the patterns may have the same size.

According to some embodiments of the present disclosure, the patterns may include a silicone resin, an acrylic resin, or an epoxy resin.

According to some embodiments of the present disclosure, the base layer may include an elastic polymer.

A display device according to embodiments of the present disclosure may include: a display panel; and a cover window positioned on the display panel, wherein the cover window may include a base layer and a hard coating layer disposed on the base layer and having a plurality of hexagonal patterns.

According to some embodiments of the present disclosure, the patterns of the hard coating layer may be separated from each other.

According to some embodiments of the present disclosure, a ratio of a maximum width of the patterns to a thickness of the patterns may be 3 to 5, and a ratio of a separation distance between the patterns to the thickness of the patterns may be ½ or less.

According to some embodiments of the present disclosure, the patterns may have a thickness of 5 μm or more and 25 μm or less.

According to some embodiments of the present disclosure, all sides of the hexagonal shapes of the patterns may have the same length.

According to some embodiments of the present disclosure, all interior angles of the hexagonal shapes of the patterns may have the same size.

According to some embodiments of the present disclosure, the patterns may include a silicone resin, an acrylic resin, or an epoxy resin, and wherein the base layer may include an elastic polymer.

According to some embodiments of the present disclosure, the display device may further include a polarization layer disposed between the display panel and the cover window.

According to some embodiments of the present disclosure, the display device may further include a back plate disposed on a rear surface of the display panel.

According to some embodiments of the present disclosure, the display device may further include a plate assembly disposed on a rear surface of the back plate.

The above description has been presented to enable any person skilled in the art to make and use the technical idea of the disclosure, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the disclosure. The above description and the accompanying drawings provide an example of the technical idea of the disclosure for illustrative purposes only. That is, the disclosed embodiments are intended to illustrate the scope of the technical idea of the disclosure.

What is claimed is:

1. A cover window for a display panel, the cover window comprising:

a base layer; and a hard coating layer on the base layer, the hard coating layer having a plurality of hexagonal patterns, wherein a part of the cover window is elongated and rolled such that a top surface of a part of the hard coating layer is in contact with a bottom surface of a part of the base layer, wherein each of the plurality of hexagonal patterns in the elongated part of the cover window is disposed spaced apart from each other, wherein each of the plurality of hexagonal patterns include a same material, and wherein the base layer is visible between the plurality of hexagonal patterns in the elongated part of the cover window.

2. The cover window of claim 1, wherein a ratio of a maximum width of the plurality of hexagonal patterns to a thickness of the plurality of hexagonal patterns is 3 to 5.

3. The cover window of claim 1, wherein a ratio of a separation distance between the plurality of hexagonal patterns to a thickness of the plurality of hexagonal patterns is 1/2 or less.

4. The cover window of claim 1, wherein the plurality of hexagonal patterns have a thickness of 5 μm or more and 25 μm or less.

5. The cover window of claim 1, wherein the plurality of hexagonal patterns have a maximum width of 25 μm or more and 110 μm or less.

6. The cover window of claim 1, wherein a separation distance between the plurality of hexagonal patterns is 12.5 um or less.

7. The cover window of claim 1, wherein all sides of hexagonal shapes of the plurality of hexagonal patterns have a same length.

8. The cover window of claim 1, wherein all interior angles of hexagonal shapes of the plurality of hexagonal patterns have a same size.

9. The cover window of claim 1, wherein the plurality of hexagonal patterns include a silicone resin, an acrylic resin, or an epoxy resin.

10. The cover window of claim 1, wherein the base layer includes an elastic polymer.

11. A display device, comprising:

a display panel; and a cover window on the display panel, wherein the cover window includes a base layer and a hard coating layer on the base layer and the hard coating layer having a plurality of hexagonal patterns, wherein a part of the cover window is elongated and rolled such that a top surface of a part of the hard coating layer is in contact with a bottom surface of a part of the base layer, wherein each of the plurality of hexagonal patterns in the elongated part of the cover window is disposed spaced apart from each other, wherein each of the plurality of hexagonal patterns include a same material, and wherein the base layer is visible between the plurality of hexagonal patterns in the elongated part of the cover window.

12. The display device of claim 11, wherein a ratio of a maximum width of the plurality of hexagonal patterns to a thickness of the plurality of hexagonal patterns is 3 to 5, and a ratio of a separation distance between the plurality of hexagonal patterns to the thickness of the plurality of hexagonal patterns is 1/2 or less.

13. The display device of claim 12, wherein the plurality of hexagonal patterns have a thickness of 5 μm or more and 25 μm or less.

14. The display device of claim 11, wherein all sides of hexagonal shapes of the plurality of hexagonal patterns have a same length.

15. The display device of claim 11, wherein all interior angles of hexagonal shapes of the plurality of hexagonal patterns have a same size.

16. The display device of claim 11, wherein the plurality of hexagonal patterns include a silicone resin, an acrylic resin, or an epoxy resin, and the base layer includes an elastic polymer.

17. The display device of claim 11, further comprising: a polarization layer between the display panel and the cover window.

18. The display device of claim 11, further comprising: a back plate on a rear surface of the display panel.

19. The display device of claim 18, further comprising: a plate assembly disposed on a rear surface of the back plate.

* * * * *